United States Patent
Meinhardt et al.

(10) Patent No.: US 8,110,886 B2
(45) Date of Patent: Feb. 7, 2012

(54) PHOTODIODE WITH INTEGRATED SEMICONDUCTOR CIRCUIT AND METHOD FOR THE PRODUCTION THEREOF

(75) Inventors: Gerald Meinhardt, Graz (AT); Franz Schrank, Graz (AT); Verena Vescoli, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 318 days.

(21) Appl. No.: 11/921,834

(22) PCT Filed: May 23, 2006

(86) PCT No.: PCT/EP2006/004903
§ 371 (c)(1),
(2), (4) Date: Dec. 6, 2007

(87) PCT Pub. No.: WO2006/131209
PCT Pub. Date: Dec. 14, 2006

(65) Prior Publication Data
US 2010/0193893 A1    Aug. 5, 2010

(30) Foreign Application Priority Data
Jun. 7, 2005   (DE) .................. 10 2005 026 242

(51) Int. Cl.
*H01L 27/146* (2006.01)
(52) U.S. Cl. .. 257/446; 257/292; 257/444; 257/E27.133

(58) Field of Classification Search .......... 257/290–294, 257/444, 446, 447, 448, 458, 460, 461, E27.133
See application file for complete search history.

(56) References Cited

U.S. PATENT DOCUMENTS

| | | | |
|---|---|---|---|
| 5,994,751 A | 11/1999 | Oppermann | |
| 6,188,093 B1 * | 2/2001 | Isogai et al. | 257/230 |
| 6,380,037 B1 | 4/2002 | Osanai | |
| 6,465,846 B1 | 10/2002 | Osanai | |
| 6,538,299 B1 | 3/2003 | Kwark et al. | |
| 6,809,008 B1 | 10/2004 | Holm et al. | |
| 6,841,816 B2 * | 1/2005 | Merrill et al. | 257/294 |
| 2002/0081766 A1 | 6/2002 | Iriguchi | |
| 2004/0013338 A1 * | 1/2004 | Bjorkman et al. | 385/14 |

FOREIGN PATENT DOCUMENTS

| | | |
|---|---|---|
| DE | 198 38 373 | 3/2000 |
| JP | 08-316450 | 11/1996 |
| JP | 2002-314061 | 10/2002 |
| WO | WO 2004/054001 | 6/2004 |

OTHER PUBLICATIONS

English Translation of JP Notification of Reasons for Refusal.

* cited by examiner

*Primary Examiner* — Jerome Jackson, Jr.
*Assistant Examiner* — Yu Chen
(74) *Attorney, Agent, or Firm* — Cozen O'Connor (57) ABSTRACT

A semiconductor circuit in a semiconductor body and a wafer bonding method for connecting the semiconductor circuit to another substrate, in which a diode is realized in a laminar structure. The semiconductor circuit is connected to the terminals of the diode by means of feedthroughs that extend through the semiconductor body.

7 Claims, 4 Drawing Sheets

PHOTODIODE WITH INTEGRATED SEMICONDUCTOR CIRCUIT AND METHOD FOR THE PRODUCTION THEREOF

RELATED APPLICATIONS

This is a U.S. national stage of application No. PCT/EP2006/004903, filed on 23 May 2006.

This patent application claims the priority of German patent application no. 10 2005 026 242.2 filed Jun. 7, 2005, the disclosure content of which is hereby incorporated by reference.

FIELD OF THE INVENTION

This invention is directed to a technique for integrating a photodiode and a semiconductor circuit in a single component.

BACKGROUND OF THE INVENTION

In known SOI (silicon on insulator) layers, a monocrystalline semiconductor layer (SOI layer) is arranged on a dielectric layer. The dielectric layer usually consists of the cover layer of a carrier substrate. CMOS circuits or even MEMS (micro-electromechanical system) components can be realized in substrates of this type.

It is known to realize semiconductor components in SOI layers by structuring the surface and particularly by producing doped regions in the surface.

Diodes, especially photodiodes, are semiconductor components that require a relatively thick semiconductor layer in order to ensure that the depletion region within the semiconductor is undisturbed. It is known to arrange photodiodes in arrays, for example, in order thereby to carry out image analyses. Here the electronic supply lines for controlling the individual diodes within the array are typically arranged on the semiconductor surface. Furthermore, additional integrated semiconductor circuits are required in order to process and, if necessary, to evaluate the signals delivered by the semiconductor array. Here the semiconductor circuits may be realized in the same substrate adjacent to the array and must be connected to the individual diodes of the array in the form of corresponding wiring. Once the array reaches a certain size, the wiring costs increase beyond the point of profitability.

It is also possible to realize the integrated semiconductor circuits on a separate substrate and to connect the integrated semiconductor circuits externally to the photodiode array. However, this also requires significant wiring costs. In addition, the achievable density of individual diodes on the available semiconductor surface is limited in embodiments with separate components as well as in those in which the components are integrated on a single substrate. Components that are realized separately furthermore require higher packaging costs.

SUMMARY OF THE INVENTION

One object of the invention is to integrate a photodiode and a semiconductor circuit in a single component that avoids the aforementioned disadvantages.

This and other objects are attained in accordance with one aspect of the present invention directed to a monolithic electric component, comprising a crystalline semiconductor body; a dielectric separation layer disposed on an underside of the semiconductor body; a laminar structure comprising different partial layers on a side of the semiconductor body opposite to the separation layer; a diode disposed in the laminar structure; a semiconductor circuit disposed on an upper side of the semiconductor body opposite to the underside; and feedthroughs through the semiconductor body which electrically connect the diode to the semiconductor circuit; wherein a rear side of the laminar structure opposite to the separation layer is available for incident light.

An embodiment of the invention combines a semiconductor body with a semiconductor circuit arranged therein and a diode realized in the form of a laminar structure in a single component, in which the diode is arranged on the rear side of the semiconductor body that lies opposite the semiconductor circuit. Here, the semiconductor circuit and the laminar structure with the diode are produced separately and connected to one another, preferably by means of wafer bonding, in a subsequent step after arranging a separation layer in between. A monolithic or quasi-monolithic component is obtained in this way. The electrical connections between the semiconductor circuit and the diode are realized with the aid of feedthroughs that lead from the upper side of the semiconductor body up to the laminar structure.

The proposed component is compact and makes available the entire rear side for the diode structure. The diode is preferably realized in the form of a photodiode, wherein the surface on the rear side of the laminar structure is available for incident light.

The diode is preferably formed on an SOI substrate in which either partial layers of the laminar structure are directly produced by means of an SOI process or additional partial layers of the laminar structure are deposited on the SOI substrate by means of CVD, preferably in an epitaxial process.

The crystalline semiconductor body for the semiconductor circuit as well as the semiconductor circuit realized in its upper side (that lies opposite the rear side), for example, by means of CMOS technology, are realized conventionally. However, it is also possible for the semiconductor circuit to comprise bipolar or hetero-bipolar circuit elements. If required by the corresponding technology for structuring the semiconductor circuit, the monocrystalline semiconductor body may accordingly comprise several layers, if necessary, of different semiconductor materials.

The semiconductor circuit is designed to control the diode, to process the signals delivered by the diode and, if required, also to evaluate these signals.

The diode is realized in a laminar structure that features at least one $n^+$-doped partial layer as the bottom layer, an n-doped partial layer arranged thereon and at least one p-doped partial layer and/or a $p^+$-doped contact doping, wherein a semiconductor junction is formed between the p-doped and n-doped partial layers. In this context, the term bottom layer refers to the layer or partial layer situated farthest from the semiconductor circuit. In other words, the component is oriented such that the surface with the semiconductor circuit points upward in this embodiment and all other embodiments discussed below.

At least two feedthroughs are provided for connecting the two terminals of the diode to the corresponding terminals of the semiconductor circuit. The feedthroughs are realized in the form of holes that are etched through the semiconductor body and extend through the separating layer that is usually realized in the form of an insulating layer up to the uppermost partial layer of the laminar structure. The feedthroughs are rendered electrically conductive by means of metallization that lines the interior of the feedthroughs or polysilicon that is adjusted to be electrically conductive.

A suitable laminar structure comprises, for example, a relatively thick n-doped partial layer that represents the greater part of the required thickness of the laminar structure. A relatively thin p$^+$-doped upper contact doping for the anode contact is realized in this n-doped partial layer. The rear-side contact or cathode contact is also realized in the form of an n$^+$-doped rear-side contact doping in an upper region of the n-doped partial layer adjacent to the aforementioned upper contact doping. This embodiment can be manufactured particularly simply because no complicated feedthroughs through the laminar structure are required for connecting the rear side contact, and both terminals on the upper side of the uppermost partial layer can be realized in the form of thin dopings.

In an alternative embodiment, the rear-side contact is realized in the form of an n-doped rear-side connecting region that extends from the bottom n$^+$-doped partial layer through all partial layers of the laminar structure situated thereon and in the uppermost region of which a relatively thin n$^+$-doped rear-side contact doping is produced for the cathode contact.

Both terminals of the diode are preferably realized in the form of highly doped contact dopings that are arranged in the upper region of the laminar structure. The corresponding feedthroughs then end directly above the contact dopings, wherein the separating layer features a recess in these regions.

The rear-side contact region that forms an electric connection between the bottom partial layer of the diode and the corresponding rear-side contact preferably extends along the outer boundary of the diode and borders this diode on at least one outer edge. The rear-side contact region may be insulated relative to the remaining laminar structure by means of a trench insulation, i.e., a trench filled with insulating material. The rear-side contact region may also enclose the entire diode surface annularly and simultaneously represent a diode insulation that borders the component on all sides.

The component preferably comprises a plurality of diodes that are arranged regularly adjacent to one another in the laminar structure, wherein at least one semiconductor circuit is arranged directly above each diode in the semiconductor body and assigned to the corresponding diode. This plurality of diodes forms a diode array that is interconnected into a single electric component by means of semiconductor circuits that are correspondingly connected to one another.

The individual diodes in the diode array can be mutually insulated by trenches that are filled with an insulating material. The trenches bordering the rear-side contact region can be used for this purpose. However, it would also be possible to provide additional trenches filled with insulating material.

The structuring of the diode array formed, in particular, by the electrically insulating separating trenches may be realized in any desired pattern. In one technically simple embodiment, each diode has a rectangular base, wherein these bases can be combined into a chessboard-like pattern in the array. However, it would also be possible to arrange individual diodes adjacent to one another in the form of rows, with two adjacent rows being mutually offset. In this case, it would also be conceivable to provide the diodes with a non-rectangular base, for example, a hexagonal or differently shaped base.

The diode is preferably realized in a laminar structure that is composed of partial silicon layers. The diode may have a pn-structure or a pin-structure. The bottom layer is preferably n-doped or n$^+$-doped.

A diode used as a photodiode preferably has a layer thickness that corresponds to the depth of penetration of the light to be detected. Visible light of long wavelength has a depth of penetration of a few tens of µm in crystalline silicon. However, it would also be possible to detect near-infrared light with an even greater depth of penetration by means of a photodiode. In a photodiode with high red sensitivity, the laminar structure will therefore have a layer thickness of approximately 10-20 µm, for example. For other applications of the photodiode in which only light of short wavelength is to be detected, the photodiode may also be realized correspondingly thinner. Here, it is advantageous to use the depletion region formed at the pn-junction to absorb the radiation and to make this depletion region thick enough that it absorbs the highest possible percentage of incident light to be detected. A fast detection of the radiation can only be achieved in this way because the charge carrier pairs are only accelerated in the field of the depletion region, but can reach the electrode contacts only in the form of slower drifting movements outside this field.

In the manufacture of the component, the semiconductor circuit is produced separately in the crystalline semiconductor body. The laminar structure and the terminals for the diode are produced on a separate substrate, particularly on an SOI substrate.

Before the semiconductor body and the laminar structure are connected, a separating layer, particularly a dielectric separating layer, for example, an oxide layer, is produced on one of the surfaces provided for this purpose. The two surfaces to be connected to one another can subsequently be ground smooth and activated for the connection, for example, by means of a plasma process. A wafer bonding method is subsequently carried out, particularly in the form of a standard low-temperature process in which the component is baked at temperatures below 400° C. These methods are CMOS-compatible and therefore can be carried out without adversely affecting the diode and the semiconductor circuit.

The diode manufacture may be based on an SOI substrate, in which an auxiliary carrier, for example, another silicon wafer, is provided with an oxide layer, onto which a second semiconductor wafer carrying at least one functional layer is subsequently applied by means of wafer bonding and then make thinner. If the second wafer already has a laminar structure on its surface, it is possible to manufacture an SOI substrate with this laminar structure by means of the wafer bonding method, but where the laminar structure is arranged on the auxiliary carrier in the reverse sequence. Consequently, it is preferred that the SOI substrate already feature an n$^+$-doped partial layer as the bottom layer above the insulator and an n-doped or intrinsic partial layer above the bottom layer. Other partial layers can subsequently be deposited thereon epitaxially, for example, a p-doped layer, in successive processes.

In all embodiments, it is sensible to produce the semiconductor junction in the vicinity of the upper side or the lower side of the laminar structure. The transition from n-doping to p-doping in the laminar structure accordingly takes place near the rear side or near the upper side. In the second case, it is possible to merely produce a p$^+$-doped contact doping in an n-doped partial layer rather than depositing a continuous p-doped partial layer.

In instances in which a pn-junction lies in the vicinity of the rear side, it is advantageous to respectively produce a p-doped partial layer above the bottom n-doped partial layer, to produce an n-doped rear-side contact doping in this partial layer immediately thereafter, namely in the region of the subsequent rear-side contact region, and to repeat the layer deposition and doping processes in the rear-side contact region several times until the desired total layer thickness is reached. This provides the advantage of realizing a homogenous doping despite a low thermal budget. In addition, the plurality of partial layers with respective rear-side contact dopings realized therein results in a uniform distribution of this doping over the entire height of the laminar structure which cannot be achieved with a single doping from the upper side if the laminar structure has a corresponding layer thickness. The doping in the rear-side contact region can be further homogenized in a subsequent tempering process.

The rear-side contact region can be realized annularly such that it encloses the base of the diode. In this case, it may be inwardly bordered by an insulating trench toward the active diode surface. However, it would also be possible for an insulating trench to border both sides of the rear-side contact region and thereby insulate the rear-side contact region relative to the remaining laminar structure and, if required, relative to the adjacent diode in the diode array.

A $p^+$-contact doping that reduces the terminal resistance may finally be produced in the uppermost partial layer of the laminar structure.

When the wafer bonding method is carried out, the laminar structure is rigidly connected to the auxiliary carrier and mechanically stabilized in this way. The wafer bonding increases the layer thickness and therefore the stability of the semiconductor body as well as the SOI substrate with its laminar structure such that the semiconductor body can be made thinner from its rear side before the wafer bonding process. In this case, the thickness of the semiconductor body is reduced to such a degree that the semiconductor body can be connected to the laminar structure without risking wafer fracture during the wafer bonding process.

Not until all structuring steps have been completed is the auxiliary carrier removed down to its insulating layer, for example, by means of a combined grinding and etching process. The auxiliary carrier is preferably ground down to slightly above the insulating layer of the SOI substrate, and the remainder is removed with an etching process. It is also possible to use etching for the entire process, for example, a spin-etching process. This provides the advantage that only the treated rear side of the component is etched and the upper side with the semiconductor circuit does not have to be additionally protected from the aggressive etching medium. Here it is possible to produce an intact insulating layer on the subsequent rear side of the component, i.e., on the surface on which the light is incident. This is advantageous with respect to the optical properties of the surface.

In addition, it is possible subsequently to apply other passivation layers and, in particular, an antireflection coating that comprises one or more layers with an optical layer thickness that respectively corresponds to one-quarter of the wavelengths. Different layers make it possible to adapt the antireflection layer to different wavelengths, so that reflection from it can be prevented in this way.

The semiconductor circuit in the semiconductor body is finished before the wafer bonding process such that the last insulating layer before the application of the contacts is applied. In one variation of the method, the contact holes for the feedthroughs may also be etched before the wafer bonding process. In this case, it is possible for the contact holes in the semiconductor body to extend slightly underneath the rear side of the semiconductor body. The openings of the contact holes then become exposed from the rear side during the subsequent thinning process.

In the other instance, the contact holes are produced after the wafer bonding process, for example, by means of a DRIE process that may be carried out with the aid of an etching mask. The separating layer between the semiconductor body and the laminar structure here may serve as an etching barrier layer and is realized, for example, with silicon oxide. If the semiconductor body is thinned to a layer thickness, for example, of approximately 205 µm before the wafer bonding process, a contact hole diameter of approximately 30 µm suffices. This contact hole diameter then results in a sufficiently low aspect ratio so that no problems with inferior coverage of the contact hole bottom are created during the subsequent deposition of the metallization.

In this variant, the separating layer on the contact hole bottom is removed by means of etching in the next step, e.g., by means of RIE. In another variant, the separating layer may already be removed in the region of the contact holes before the wafer bonding process. Subsequently, the contact hole is electrically insulated on the inner walls, wherein the bottom of the contact hole remains exposed. For this purpose, spacers are produced on the inner walls by comformally and isotropically depositing an auxiliary layer within the contact holes and etching back this auxiliary layer by means of an anisotropic etching process until the auxiliary layer is completely removed from the contact hole bottom.

The metallization is preferably carried out with the metal that forms the uppermost metal layer in the semiconductor circuit technique used. However, it is also possible to utilize different metals that exhibit, for example, adequate conformity during the deposition, also at great trench depths and high aspect ratios. In light of the relatively large contact hole diameter, it suffices merely to deposit the metallization up to a desired layer thickness. The remaining interior can subsequently be filled with a dielectric such as a polymer, particularly a polyimide. However, it would also be conceivable to leave the interior of the contact hole open.

After the contact holes are filled, any protruding material may be removed by surface planarization. Subsequently, the metallization that is also applied to the surface of the semiconductor body is structured in such a way that corresponding wiring structures such as connecting lines and contact pads are simultaneously formed. This can be promoted in that the last anisotropic etching step for producing openings in the insulating layer above the semiconductor body is used for exposing deeper metallizations. The metallization to be applied then contacts this deeper metallization.

Another passivation layer may be subsequently applied to the surface of the component over the semiconductor structure and the metallization, wherein openings for exposing contact pads are subsequently produced in this additional passivation layer.

BRIEF DESCRIPTION OF THE DRAWINGS

The invention is described in greater detail below with reference to embodiments illustrated in the corresponding figures. These figures merely serve for elucidating the invention and represent schematic figures that are not drawn true-to-scale. Identical parts or parts that fulfill identical functions are designated with the same reference symbols.

BRIEF DESCRIPTION OF THE DRAWINGS

Figure 1:
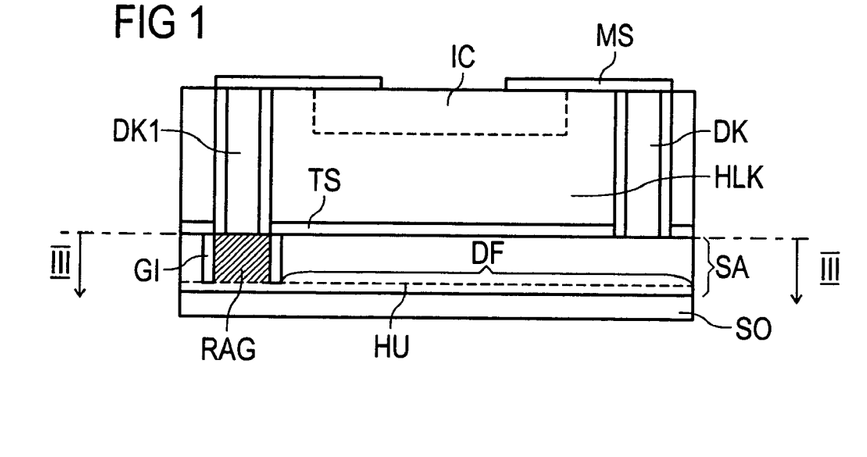
FIG. 1 shows a schematic cross section through a first embodiment of the invention.

FIG. 1 shows a schematic cross section through an inventive component. In a semiconductor body HLK, an integrated circuit IC is realized in the vicinity of the surface of the semiconductor body. A dielectric separation layer TS separates the semiconductor body from a laminar structure SA comprising n-doped and p-doped partial layers that form a semiconductor junction HU in the laminar structure SA. The bottom of the component is closed with an insulating layer SO.

Feedthroughs DK extending through the semiconductor body HLK connect the terminals of the integrated circuit IC to the functional layers of the laminar structure SA via metallization MS. The semiconductor junction HU is arranged in the vicinity of the rear side of the component and connected to the feedthrough arranged on the top by means of a doped rear-side contact region RAG. The rear-side contact region ensures a low-resistance connection through the laminar structure and is inserted relative to it by means of a trench insulation GI.

Figure 2:
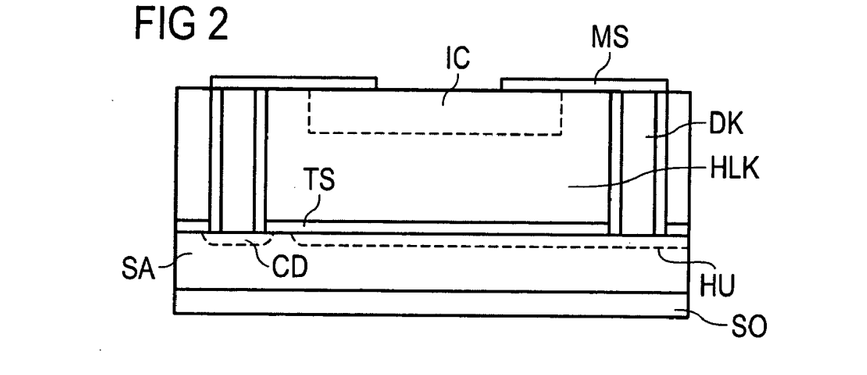
FIG. 2 shows a schematic cross section through a second embodiment of the invention.

FIG. 2 shows a second embodiment of the inventive component, in which the semiconductor junction HU is arranged in the vicinity of the upper surface of the laminar structure SA and realized in the form of a flat doping. The feedthrough illustrated on the right side of the figure connects the upper surface of the doped region formed by the flat doping to corresponding terminals of the semiconductor circuit IC via metallization MS. The second feedthrough DK illustrated on the left side in the figure contacts an oppositely doped region CD formed on the surface of the laminar structure adjacent to the flat doping, namely the rear-side contact doping.

Figure 3:
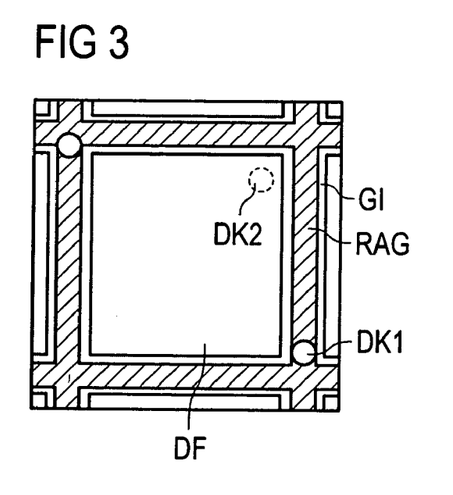
FIG. 3 shows a cross section taken along line III-III in FIG. 1.

FIG. 3 shows a schematic cross section through the laminar structure parallel to its surface. The rear-side contact region RAG that forms a low-resistance connection between the bottom partial layer of the laminar structure and the upper side of the laminar structure is realized in the form of a trench, wherein the trench is realized in the form of a closed annular trench that encloses the actual diode surface DF. The rear-side contact region RAG is surrounded by a trench insulation GI on both sides and is thereby insulated relative to the remaining laminar structure. A dotted line indicates the positions of the feedthroughs DK that are not visible in this plane of section. At least one feedthrough DK2 is arranged within the diode surface DF enclosed by the rear-side contact region and another feedthrough DK2 is arranged in the region of the rear-side contact region RAG. It would also be possible to provide more than two of the aforementioned feedthroughs per component.

Figure 4:
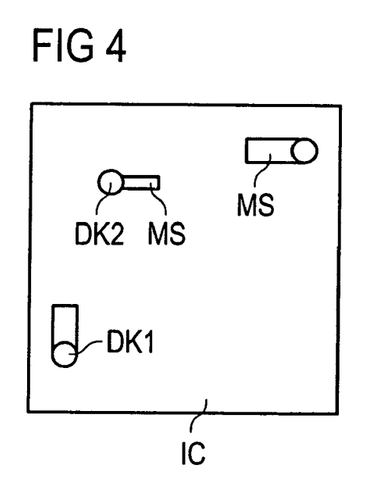
FIG. 4 shows a top view of the component.

FIG. 4 shows the component in the form of a top view of the semiconductor body surface. All feedthroughs DK end at this location and are connected to corresponding terminals of the semiconductor circuit IC (not illustrated in the figure) via metallizations MS that are realized or structured in the form of short strip conductor sections.

FIG. 5 shows different steps of a first variant of the method during the manufacture of a diode from a laminar structure. According to FIG. 5A, the component is formed on an SOI substrate that is arranged on an auxiliary carrier ST and features an insulator SO and two partial layers of a semiconductor arranged thereon, namely a first $n^+$-doped partial layer N1 and a second n-doped partial layer N2. The two partial layers may be produced by means of an SOI process.

Figure 5A:
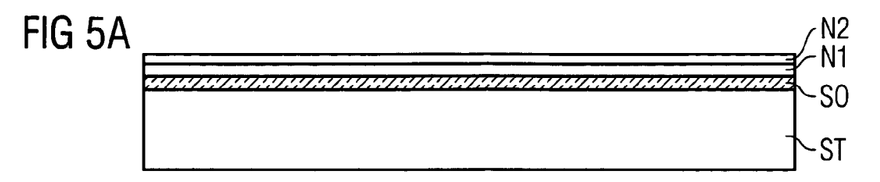
FIG. 5 shows different steps during the manufacture of a laminar structure.

However, it is also possible to form the component on an SOI substrate with a single partial layer on which other partial layers are deposited, preferably epitaxially. The desired dopings can be produced by means of the SOI process as well as the epitaxial deposition.

Figure 5B:
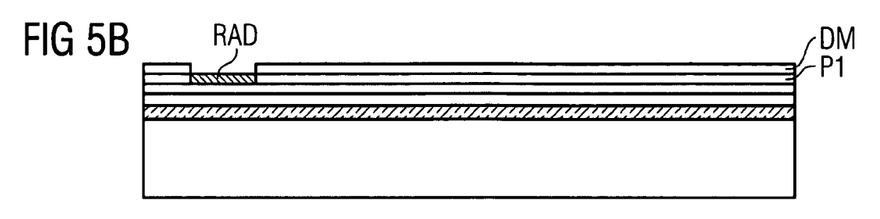

A first p-doped partial layer P1 with a thickness of approximately 3 μm is now produced on both n-doped partial layers N1, N2 epitaxially. An n-doped region, i.e., the rear-side contact doping RAD, is now produced for the rear-side terminal in this first p-doped partial layer with the aid of a doping mask DM. FIG. 5B shows the arrangement during this processing step.

Figure 5C:
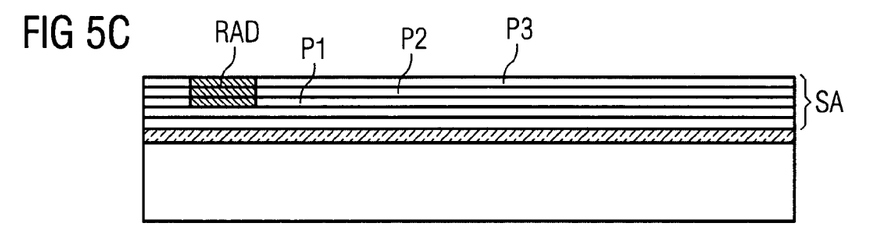

The doping mask is subsequently removed and another p-doped partial layer P2 is applied to the same thickness and once again doped in the region of the rear-side terminal with the aid of another doping mask. These steps can be repeated several times until a sufficient number of p-doped layers is formed which collectively have the desired thickness of the laminar structure, for example, 10 μm. Three p-doped partial layers P1 to P3 are illustrated in the figure. The rear-side contact doping RAD may be made uniform by means of a tempering step after filling the insulating trenches IG with insulating material such that a rear-side contact region RAG with continuously uniform doping distribution is obtained.

Figure 5D:
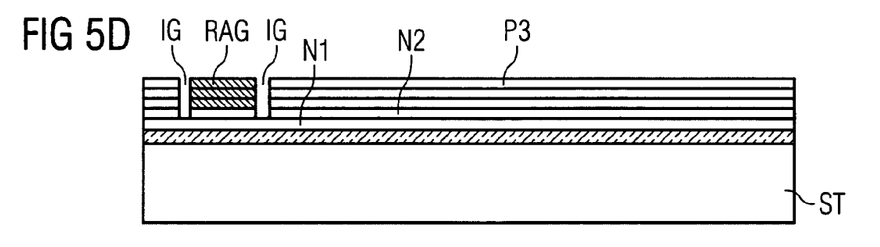

In the next step, insulating trenches IG are etched on both sides of the rear-side contact region RAG, for example, with an aspect ratio of 1:5 to 1:10. FIG. 5D shows the arrangement during this processing step. The insulating trenches IG extend at least through all p-doped layers P1 to P3 and end in the region of the second n-doped partial layer N2 or above the first partial layer P1.

Figure 5E:
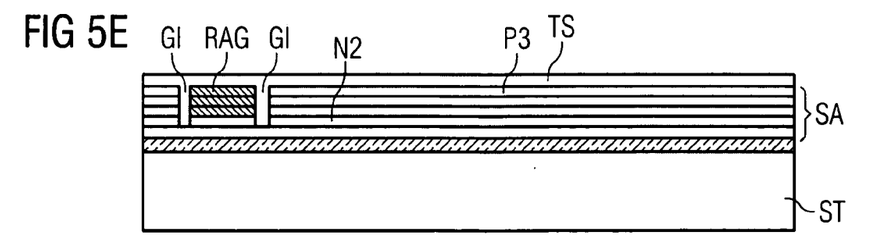

In the next step, the insulating trenches IG are filled with an insulating material. This can be realized by means of uniform or isotropic deposition of insulating material. This process can be thermally promoted such that a thermal oxide grows in the trench walls as well as on the surface of the laminar structure. Suitable deposition methods are SACVD (sub-atmospheric CVD), PECVD (plasma-enhanced CVD) and HDP-oxide (high-density plasma). One suitable process, e.g., is a TEOS (tetra-ethyl-ortho-silicate) process promoted within an ozone atmosphere. During the deposition of the insulating material, particularly an oxide, the surface of the laminar structure SA is also covered and the insulating material may remain at this location as a separation layer TS. If required, the separating layer can be subsequently ground off or planarized. FIG. 5E shows the arrangement during this processing step.

The laminar structure can now be connected to a semiconductor body by means of wafer bonding, e.g., in the form of plasma activation, and baking at a temperature of no more than 400° C. The wafers may be made thinner prior to these processes.

Figure 6:
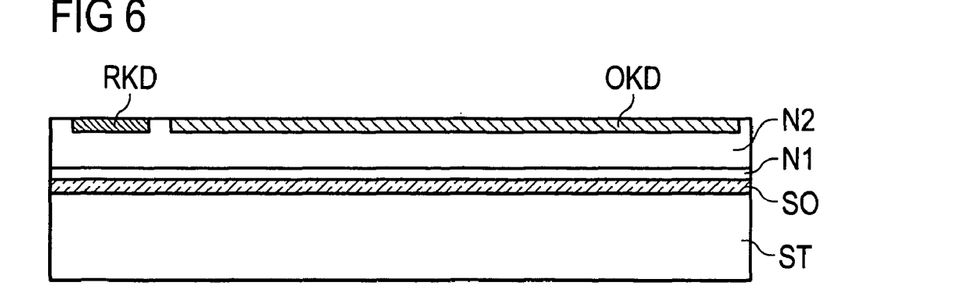
FIG. 6 shows a schematic cross section through a laminar structure manufactured by means of an alternative variant.

FIG. 6 shows the result of a second variant of the method that is based on an SOI substrate with a first $n^+$-doped partial layer N1 and a second, relatively thick n-doped partial layer N2. The partial layers of the SOI substrate collectively have a thickness that corresponds to the desired overall thickness of the laminar structure SA.

A surface contact OKD is now produced in a limited surface region by doping with $p^+$material. A rear-side contact doping RKD is then produced in a different surface region by means of $n^+$-doping. This rear-side contact doping serves for connecting the n-doped partial layers such that n-doped and p-doped partial layers can now be connected on the surface of the laminar structure. A separation layer TS is then produced on this laminar structure that is illustrated in FIG. 6 and planed, if required.

Alternatively, the rear-side contact doping RKD may be insulated relative to the remaining laminar structure similarly to the above-described rear-side contact region RAG before or after the production of the separation layer TS by means of insulating trenches.

Figure 7:
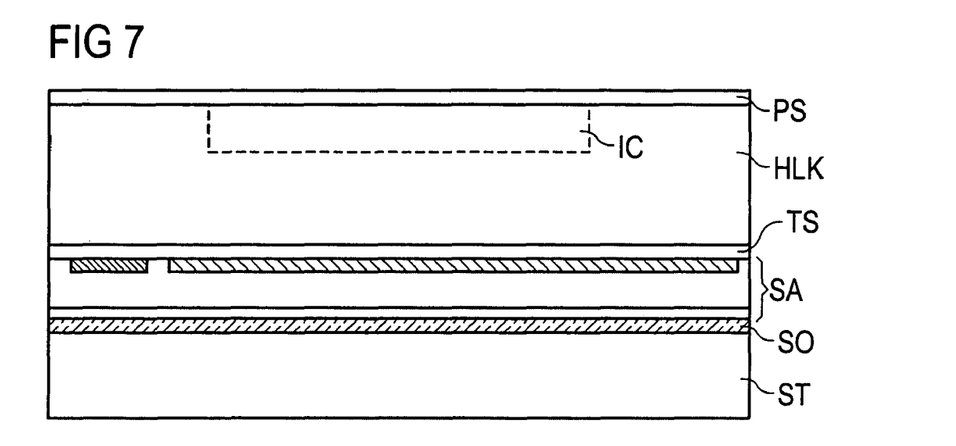
FIG. 7 shows the component after the wafer bonding process.

Planarization may be realized in the form of chemical-mechanical polishing (P), during which a surface roughness on the order of angstroms is achieved. Wafer bonding is then used to connect the entire laminar structure to a semiconductor body HLK, where the surface that is not used for the bonding process is used to form the semiconductor circuit IC and is covered with a passivation layer PS. FIG. 7 shows the arrangement after the wafer bonding process.

Figure 8:
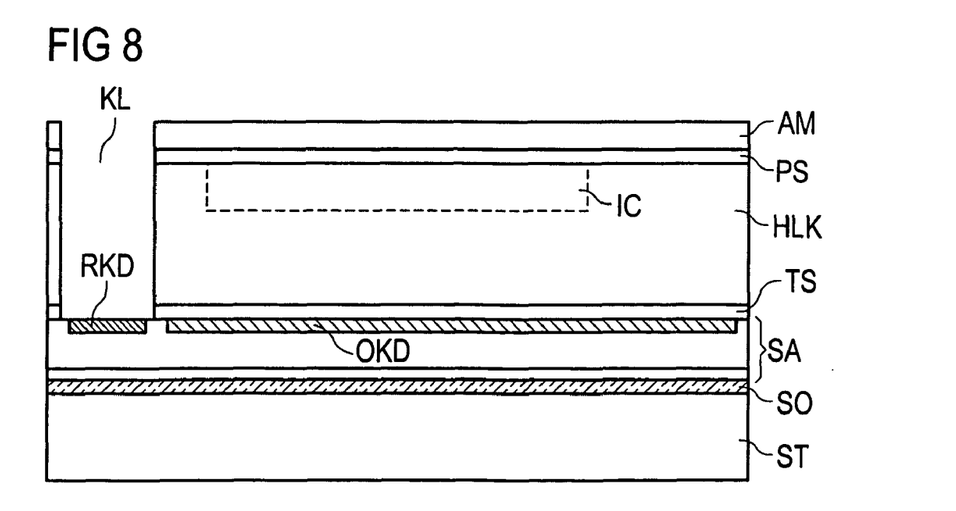
FIG. 8 shows the component after the formation of the contact holes.

In the next step, the contact holes are anisotropically etched through the semiconductor body by means of a DRIE (deep reactive ion etching) process. The structuring is carried out with the aid of an etching mask AM. The separation layer TS that serves as an etching barrier is subsequently removed by means of another RIE (reactive ion etching) process so that the surface of the laminar structure is exposed in the contact hole KL formed thereby. At least one contact hole is realized in the region of the rear-side contact doping RKD and another contact hole (not shown in the figure) ends in the region of the upper contact doping OKD. FIG. 8 shows the arrangement during this processing step.

Figure 9:
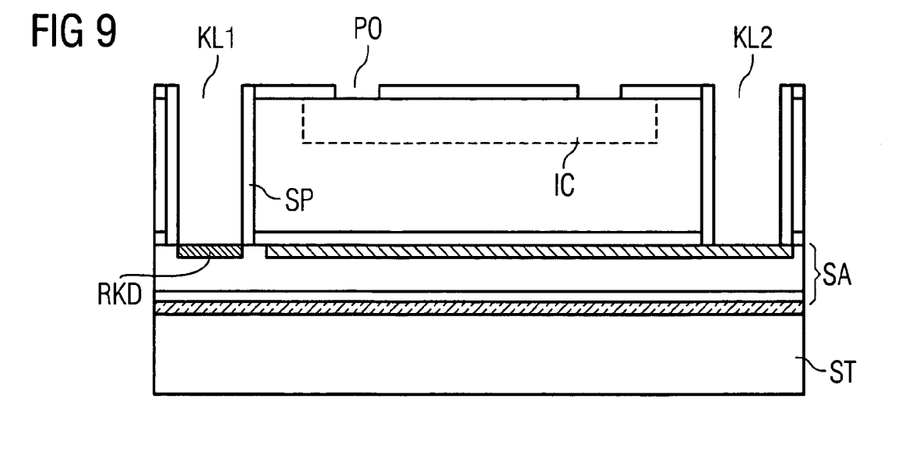
FIG. 9 shows the component after the realization of the spacers.

The internal insulation of the contact holes may be realized, for example, with a PECVD oxide, wherein a layer thickness on the order of 1 µm or less suffices. An RIE spacer etching process is then carried out during which the oxide layer at the bottom of the contact hole is removed while the insulating spacers SP remain on the side walls. This spacer etching process is advantageously carried out with the aid of another etching mask in order to simultaneously form openings PO in the passivation layer PS, in which terminals of the semiconductor circuit IC are exposed. FIG. 9 shows the arrangement during this processing step, wherein this figure shows both types of contact holes for connecting the n-doped and the p-doped partial layers of the laminar structure.

Figure 10:
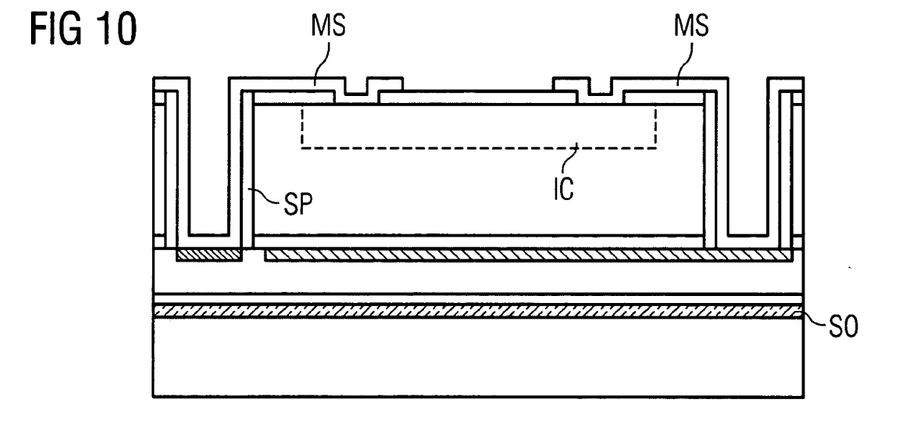
FIG. 10 shows the component after the deposition and structuring of a metallic coating.

In the next step, a full-surface metallization MS is produced which covers all exposed surface areas of the semiconductor body surface and fills the contact holes. The metallization MS is then structured so that corresponding connecting lines leading to the exposed terminals of the semiconductor circuit IC in the openings PO are formed on the surface of the semiconductor body. During this process, the metallizations between both contact holes KL1 and KL2 are electrically separated, as is also the case with connections to other components that were simultaneously produced, if applicable, over a large surface in the same substrate. FIG. 10 shows the arrangement during this processing step.

The contact hole is subsequently provided with an insulating contact hole filling KF, and the remaining surface of the semiconductor body is provided with a second passivation layer PS2 in order to protect the CMOS structures.

Figure 11:
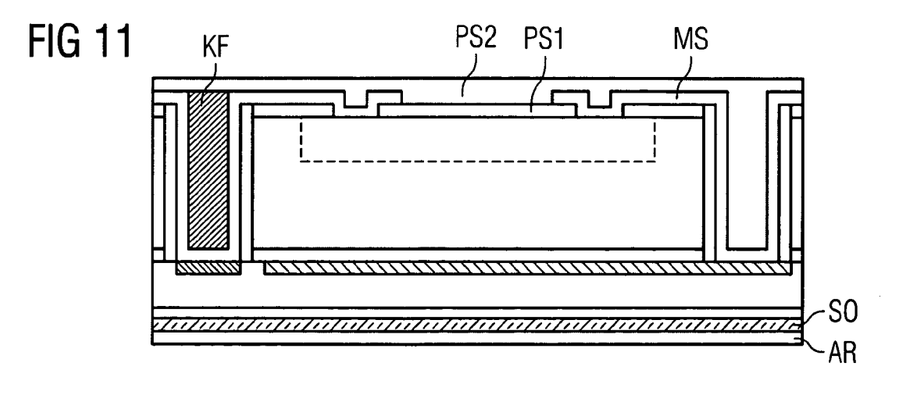
FIG. 11 shows a schematic cross section through the finished component.

In the next step, an auxiliary carrier ST is removed, wherein a spin-etching method may be selectively used for this purpose. In this case, the surface of the insulator SO is exposed and subsequently provided with a passivation and/or an anti-reflection layer AR. FIG. 11 shows the arrangement during this processing step. At this point, it is merely required to produce the electric connections in the form of openings through the second passivation layer PS2 in order to complete the component.

Although only the manufacture of one diode and one semiconductor circuit as well as their interconnection into a component were described above with reference to the embodiments, the method can also be easily carried out with large-surface SOI substrates and equally large-surface semiconductor bodies (wafers). In this case, the structuring steps are carried out such that a plurality of electrodes that are electrically separated from one another and semiconductor circuits that are electrically separated from one another are produced adjacent to one another in a regular pattern. At the conclusion of the method, it is possible to separate the large-surface substrates and semiconductor bodies into individual components. However, it is also possible to manufacture a diode array and, in particular, a photodiode array in this way.

Furthermore, the invention is not limited to the illustrated embodiments. The manufacture of the laminar structure may also be based on different SOI substrates. The doping of partial layers can be realized in the form of the deposition of correspondingly doped CVD layers, preferably epitaxial layers, in the form of implantation or as an integral part of the SOI process. The two described variants of the method for manufacturing the laminar structure make it possible to arbitrarily increase the layer thickness of the laminar structure without reducing the performance of the component. The laminar structure for the diode is also not limited to silicon layers. It would also be possible to combine other materials that are conventionally used for photodiodes and other diodes into a laminar structure in the same way. The partial layers may also contain additives that regulate the band gap, such as germanium or nitrogen. It would also be conceivable to use silicon layers that contain carbon as partial layers of the laminar structure.

The invention claimed is:

1. A monolithic electric component, comprising:
    a crystalline semiconductor body;
    a laminar structure comprising an n-doped layer and a p-doped layer forming a semiconductor junction of a diode;
    a dielectric separation layer disposed between the crystalline semiconductor body and the laminar structure;
    an integrated circuit having at least two terminals disposed on an upper side of the crystalline semiconductor body opposite to the dielectric separation layer;
    a feedthrough comprising a metallization connecting one of the at least two terminals of the integrated circuit to the laminar structure;
    a rear-side contact region disposed in the laminar structure adjacent to the semiconductor junction, wherein the rear-side contact region is configured as a closed annular trench enclosing a surface of the diode;
    a trench insulation surrounding the rear-side contact region on both sides to insulate the rear-side contact from the remaining laminar structure; and
    a further feedthrough comprising a further metallization connecting another of the at least two terminals of the integrated circuit to the rear-side contact region,
    wherein a rear side of the laminar structure opposite to the dielectric separation layer is available for incident light.

2. The component according to claim 1, wherein the feedthrough and the further feedthrough are holes that extend through the dielectric separation layer to the top layer of the laminar structure and are respectively internally lined with the metallization and the further metallization.

3. The component according to claim 2, wherein the laminar structure comprises at least an $n^+$-doped partial layer as a bottom layer, and the rear-side contact region connects the $n^+$-doped bottom layer with the further feedthrough.

4. The component according to claim 3, wherein the rear-side contact region extends on a portion of the diode and is insulated relative to the remaining laminar structure by the trench insulation on side walls of the rear-side contact region.

5. The component according claim 1, comprising a plurality of regularly arranged diodes and semiconductor circuits that are respectively connected to one another.

6. The component according to claim 5, wherein individual diodes of the plurality of regularly arranged diodes are mutually insulated by said trench insulation.

7. The component according to claim 1, wherein the diode comprises partial silicon layers that are at least partially formed epitaxially.

* * * * *